US011821929B2

(12) United States Patent
Zhou et al.

(10) Patent No.: US 11,821,929 B2
(45) Date of Patent: Nov. 21, 2023

(54) QUASI-REAL-TIME DATA COLLECTION SYSTEM AND METHOD FOR COMPETITIVE POWER MARKET

(71) Applicants: State Grid Jiangsu Electric Power Co., Ltd. Marketing Service Center, Jiangsu (CN); State Grid Jiangsu Electric Power Co., Ltd., Jiangsu (CN); State Grid Corporation of China, Beijing (CN)

(72) Inventors: Chao Zhou, Jiangsu (CN); Shuangshuang Zhao, Jiangsu (CN); Meimei Duan, Jiangsu (CN); Xiao Chen, Jiangsu (CN); Qing Xu, Jiangsu (CN); Dan Gong, Jiangsu (CN); Zhengqi Tian, Jiangsu (CN); Guofang Xia, Jiangsu (CN); Zengkai Ouyang, Jiangsu (CN); Xiaoxing Mu, Jiangsu (CN); Xiaodong Cao, Jiangsu (CN)

(73) Assignees: State Grid Jiangsu Electric Power Co., Ltd. Marketing Service Center, Nanjing (CN); State Grid Jiangsu Electric Power Co., Ltd., Nanjing (CN); State Grid Corporation of China, Beijing (CN)

( * ) Notice: Subject to any disclaimer, the term of this patent is extended or adjusted under 35 U.S.C. 154(b) by 12 days.

(21) Appl. No.: 17/611,174

(22) PCT Filed: Sep. 14, 2021

(86) PCT No.: PCT/CN2021/118341
§ 371 (c)(1),
(2) Date: Nov. 14, 2021

(87) PCT Pub. No.: WO2022/057798
PCT Pub. Date: Mar. 24, 2022

(65) Prior Publication Data
US 2022/0308101 A1 Sep. 29, 2022

(30) Foreign Application Priority Data

Sep. 15, 2020 (CN) .......................... 202010965981.9
Sep. 15, 2020 (CN) .......................... 202022013077.6

(51) Int. Cl.
*G01R 22/06* (2006.01)
*H04Q 9/00* (2006.01)

(52) U.S. Cl.
CPC ............. *G01R 22/063* (2013.01); *H04Q 9/00* (2013.01); *H04Q 2209/60* (2013.01)

(58) Field of Classification Search
CPC .. H04Q 9/00; H04Q 2209/00; H04Q 2209/10; H04Q 2209/30; H04Q 2209/60;
(Continued)

(56) References Cited

U.S. PATENT DOCUMENTS

| 2001/0038343 A1* | 11/2001 | Meyer | ................... | G01R 22/00 |
| | | | | 340/870.28 |
| 2009/0146839 A1* | 6/2009 | Reddy | ................... | G01D 21/00 |
| | | | | 340/870.02 |

FOREIGN PATENT DOCUMENTS

WO WO-2019009501 A1 * 1/2019 ............. G01D 4/002

* cited by examiner

*Primary Examiner* — Franklin D Balseca

(57) ABSTRACT

A quasi-real-time data collection system for a competitive power market includes a distributed data collection unit, a centralized data collection unit, and a main collection station, where the distributed data collection unit is connected to an intelligent watt-hour meter by using an internal downlink communication module of the distributed data collection unit, and configures data item collection parameters and task execution parameters by using an internal collection task and scheme configuration module of the distributed data collection unit; the centralized data collection unit is connected to the main collection station by using an internal file (Continued)

conversion and uplink communication module of the centralized data collection unit; and the centralized data collection unit is connected to multiple distributed data collection units by using a local high speed power line carrier communication (HPLC) network.

15 Claims, 5 Drawing Sheets

(58) Field of Classification Search
CPC .......... H04Q 2209/70; H04Q 2209/75; H04Q 2209/80; G01D 4/00; G01D 4/002; G01D 4/004; G01D 4/008; H04B 2203/54; H04B 2203/5404; H04B 2203/5429; H04B 2203/5433; H04B 2203/5462; H04B 3/54; H04B 3/542; H04B 3/544; H04B 3/546; G01R 22/00; G01R 22/063
See application file for complete search history.

QUASI-REAL-TIME DATA COLLECTION SYSTEM AND METHOD FOR COMPETITIVE POWER MARKET

TECHNICAL FIELD

The present disclosure relates to the field of intelligent measurement and communication, and more specifically, to a quasi-real-time data collection system and method for a competitive power market.

BACKGROUND

Power market construction is started in China's new round of power system reform. The new power system reform is intended to further introduce competition by gradually liberalizing an electricity selling business, improve an operation mechanism of a power market, encourage more market subjects to participate in transactions, and give full play to a decisive role of the market in resource allocation. The construction of a spot market and the continuous liberalization of an electricity selling market increase a quantity of market subjects, diversify types of the subjects, strengthen market competition, and make a price mechanism more flexible. In addition, as a high proportion of renewable energy sources are used to generate power to be transported to a power grid, and multiple loads such as a large quantity of distributed energy sources, electric vehicles, and energy storage apparatuses are accessed, an important regulation means of the power grid in a market environment is to use flexible load resources on a demand side to interact with the power grid. A time-of-use price signal will appear in the market to guide interaction between a load and the power grid. Users will respond to system prices and incentives of the power grid to flexibly adjust their own electricity demands.

A current electricity consumption information collection system supports collection of daily frozen data, monthly frozen data, and 15-minute historical curve data of a previous day. Therefore, it is difficult to realize minute-level quasi-real-time data collection due to existing full-carrier and half-carrier local communication network architectures, a concentrator-based unified dispatching and collection mode, and a limitation on a speed of communication between a carrier communication module and a serial port of a watt-hour meter. Due to a large quantity of user nodes in local communication, a local communication network is vulnerable to interference from an operating load. Under the traditional full-carrier and half-carrier network architectures, efficiency of collecting electricity consumption data based on task dispatching of a centralized meter reading terminal is low, and it is difficult to perform quasi-real-time data collection. At present, during implementation of a user-side demand response project, an additional data collection module is installed, and 4G and other remote communication units are directly connected to a main station, resulting in a huge cost of repeated construction.

Therefore, a quasi-real-time data collection system and method for a competitive power market are urgently needed in the corresponding technical field to be compatible with the existing electricity consumption information collection system, realize quasi-real-time reporting of electricity consumption data, and provide technical support for constructing the competitive power market.

SUMMARY

To overcome the shortcomings in the prior art, the present disclosure is intended to provide a quasi-real-time data collection system and method for a competitive power market, to resolve a problem of poor real-time performance of data collection of an existing electricity consumption information collection system.

The present disclosure adopts the following technical solutions. A quasi-real-time data collection system for a competitive power market includes a distributed data collection unit, a centralized data collection unit, and a main collection station, where the distributed data collection unit is connected to an intelligent watt-hour meter by using an internal downlink communication module of the distributed data collection unit, and configures data item collection parameters and task execution parameters by using an internal collection task and scheme configuration module of the distributed data collection unit, including: a quasi-real-time collection task, a 15-minute curve task, a daily data freezing task, and a monthly data freezing task; the centralized data collection unit is connected to the main collection station by using an internal file conversion and uplink communication module of the centralized data collection unit; and the centralized data collection unit is connected to multiple distributed data collection units by using a local high speed power line carrier communication (HPLC) network composed of an internal main HPLC module of the centralized data collection unit and an internal HPLC submodule of the distributed data collection unit.

Preferably, the collection task and scheme configuration module of the distributed data collection unit is further configured to configure at least a collection scheme number, a storage depth, a collection mode, a watt-hour meter set, a storage time mark, and an electricity consumption data identifier.

Preferably, the distributed data collection unit further includes: a quasi-real-time data collection task starting module, connected to the collection task and scheme configuration module, and configured to start the quasi-real-time collection task, the 15-minute curve task, the daily data freezing task, and the monthly data freezing task in a specified order.

Preferably, the quasi-real-time data collection task starting module receives a clock message of the main HPLC module by using the HPLC submodule.

Preferably, both a data storage module of the centralized data collection unit and a data storage module of the distributed data collection unit are flash memories.

Preferably, the centralized data collection unit includes: a user-based data reading module, configured to enable, by using a user-based meter reading message, the data storage module of the distributed data collection unit to perform data reporting.

Preferably, the main HPLC module of the centralized data collection unit is configured to perform data exchange with the user-based data reading module in a concurrent meter reading mode, and the main HPLC module supports a variety of communication baudrates, and preferentially uses a high baudrate for communication.

Preferably, the file conversion and uplink communication module of the centralized data collection unit is configured to generate a compressed file for data in the data storage module of the centralized data collection unit and perform data exchange with the main collection station.

The present disclosure further provides a quasi-real-time data collection method based on the quasi-real-time data collection system for a competitive power market, including the following steps:

step 1: powering on the distributed data collection unit, and collecting, by the downlink communication module of the distributed data collection unit, a clock of the watt-hour meter, and using the clock as a clock of the distributed data collection unit;

step 2: performing, by the HPLC submodule of the distributed data collection unit, networking and clock synchronization with the main HPLC module of the centralized data collection unit, and if a clock message of the main HPLC module is received, starting, by the quasi-real-time data collection task starting module of the distributed data collection unit, a quasi-real-time data task;

step 3: exchanging, by the centralized data collection unit, user-based read data with the distributed data collection unit by using an HPLC channel; and step 4: summarizing, by the centralized data collection unit, user-based read data of multiple distributed data collection units, generating a file, and reporting the file to the main collection station.

Preferably, step 2 further includes: starting a 15-minute curve task, a daily data freezing task, and a monthly data freezing task in a specified order.

Preferably, the exchanging user-based read data in step 3 specifically includes:

step 3.1: sending, by the user-based data reading module of the centralized data collection unit, a "user-based meter reading enabling" message to the distributed data collection unit;

step 3.2: sending, by the distributed data collection unit, a "data reporting" message to the user-based data reading module after receiving the "user-based meter reading enabling" message;

step 3.3: sending, by the user-based data reading module, a "reporting acknowledgement" message to the distributed data collection unit after receiving the "data reporting" message;

step 3.4: after receiving the "reporting acknowledgement" message, continuously sending, by the distributed data collection unit, a "data reporting" message to the user-based data reading module and returning to perform step 3.3 if there still is data to be reported; or sending a "negative data reporting acknowledgement/subsequent frame unavailability" message to the user-based data reading module if there is no data to be reported;

step 3.5: sending, by the user-based data reading module, a "user-based meter reading disabling" message to the distributed data collection unit after receiving the "negative data reporting acknowledgement/subsequent frame unavailability" message; and step 3.6: sending, by the distributed data collection unit, a "user-based meter reading disabling acknowledgement" message to the user-based data reading module after receiving the "user-based meter reading disabling" message, to complete a round of user-based meter reading, and returning to perform step 3.1.

Preferably, in step 3, when the distributed data collection unit sends the "data reporting" message to the centralized data collection unit, if a communication abnormality occurs and reported data is lost due to the abnormality, the user-based data reading module performs timeout processing, stops a current user-based meter reading task, and returns to perform step 3.1; and in a next round of user-based meter reading, the distributed data collection unit resends the "data reporting" message that is not successfully reported in a previous round of user-based meter reading.

Preferably, in step 3, when the centralized data collection unit sends the "reporting acknowledgement" message to the distributed data collection unit, if a communication abnormality occurs and reported data is lost due to the abnormality, the user-based data reading module performs timeout processing, stops a current round of user-based meter reading, and returns to perform step 3.1; and in the next round of user-based meter reading, the distributed data collection unit resends the "data reporting" message that is not successfully reported in the previous round of user-based meter reading.

Preferably, in step 4, the centralized data collection unit reports, to the main collection station, data reported by the distributed data collection unit by using a simplified data reporting protocol, where the simplified data reporting protocol is framed in an order of an object attribute descriptor (OAD), a record selection descriptor (RSD), a record object attribute descriptor (ROAD), and response data.

Preferably, in step 4, the response data is framed in an order of a record column data type and multiple record data values.

The present disclosure has the following beneficial effects: Compared with the prior art, a collection task and a collection scheme are distributed to the distributed data collection unit, the centralized data collection unit performs user-based meter reading on each distributed data collection unit, and the centralized data collection unit generates a file and reports the file to the main collection station. The present disclosure realizes concurrent asynchronous meter reading for the centralized data collection unit and the distributed data collection unit, greatly improves timeliness of electricity consumption data, and has a good application prospect.

DETAILED DESCRIPTION

The prevent disclosure is further described below with reference to the accompanying drawings. The following embodiments are only used for describing the technical solutions of the present disclosure more clearly, and are not intended to limit the protection scope of the present disclosure.

Figure 1:
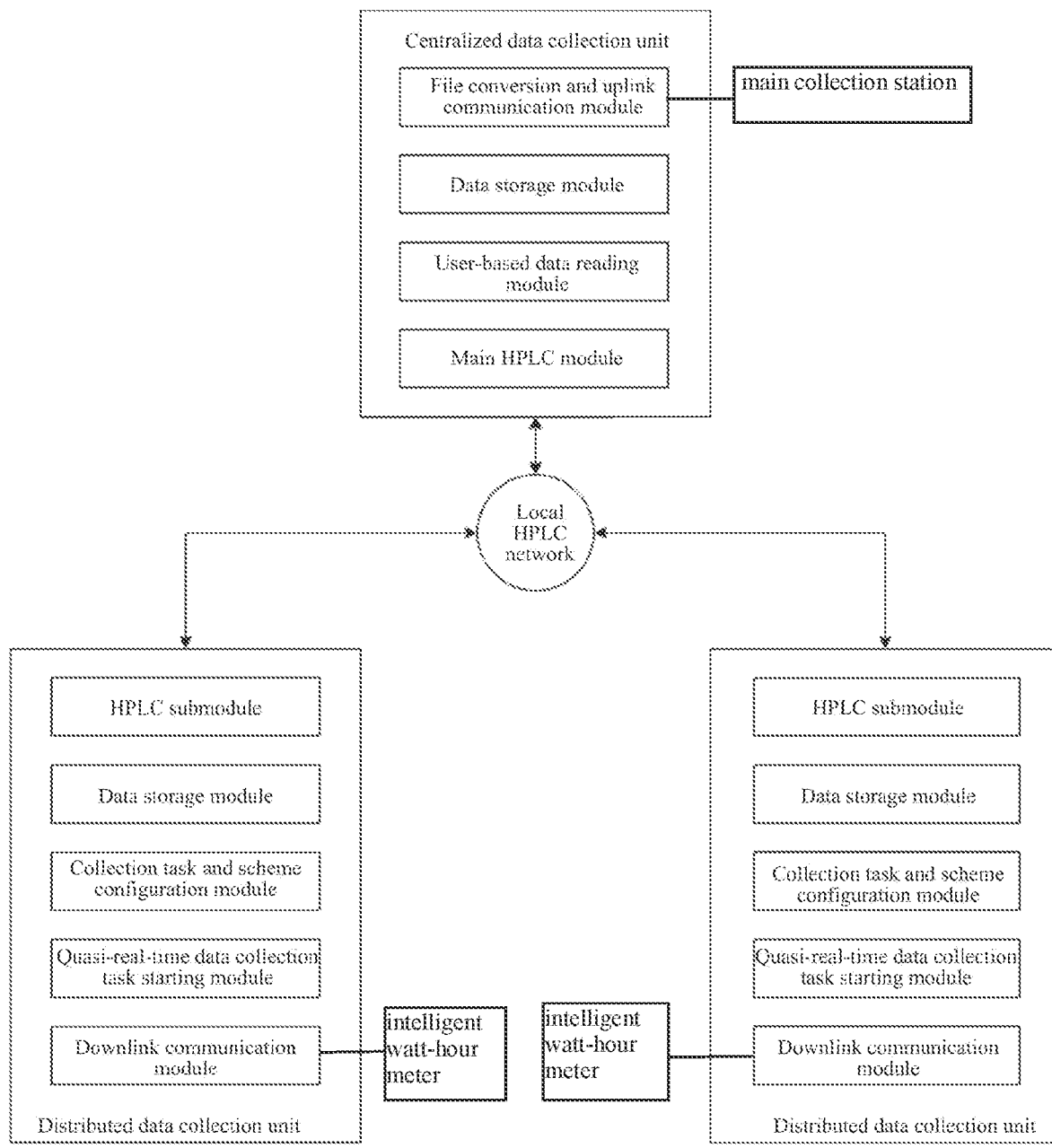
FIG. 1 shows a system architecture of a quasi-real-time electricity consumption data collection system for a competitive power market.

Embodiment 1: Quasi-Real-Time Data Collection System for a Competitive Power Market As shown in FIG. 1, the present disclosure provides a quasi-real-time data collection system for a competitive power market, including a distributed data collection unit, a centralized data collection unit, and a main collection station.

The distributed data collection unit includes a downlink communication module, a quasi-real-time data collection task starting module, a collection task and scheme configuration module, a data storage module, and an HPLC submodule.

The centralized data collection unit includes a file conversion and uplink communication module, a user-based data reading module, a data storage module, and a main HPLC module.

The distributed data collection unit is connected to an intelligent watt-hour meter by using the downlink communication module. The centralized data collection unit is connected to the main collection station by using the file conversion and uplink communication module. The centralized data collection unit is connected to multiple distributed data collection units by using a local HPLC network composed of the main HPLC module and the HPLC submodule.

Those skilled in the art can arbitrarily configure the downlink communication module of the distributed data collection unit based on an actual need on site. The downlink communication module is preferably but not limited to an RS485 communication module or another communication module.

The collection task and scheme configuration module of the distributed data collection unit is configured to configure data item collection parameters and task execution parameters, including but not limited to a quasi-real-time collection task, a 15-minute curve task, a daily data freezing task, and a monthly data freezing task, as well as a collection scheme number, a storage depth, a collection mode, a watt-hour meter set, a storage time mark, and an electricity consumption data identifier. Table 1 shows a task configuration scheme, Table 2 shows a three-phase watt-hour meter collection scheme, and Table 3 shows a single-phase user collection scheme.

TABLE 1

Task configuration scheme

| Serial number (SN) | Task ID | Execution frequency | Scheme type | Scheme number | Delay | Note |
|---|---|---|---|---|---|---|
| 1 | 1 | 1 min | Ordinary collection scheme | 1 | 0 min | Three-phase watt-hour meter collection task |
| 2 | 2 | 1 day | Ordinary collection scheme | 2 | 5 min | Three-phase watt-hour meter collection task |
| 3 | 3 | 1 month | Ordinary collection scheme | 3 | 5 min | Three-phase watt-hour meter collection task |
| 4 | 4 | 15 min | Ordinary collection scheme | 4 | 5 min | Three-phase watt-hour meter collection task |
| 5 | 5 | 1 min | Ordinary collection scheme | 5 | 0 min | Single-phase watt-hour meter collection task |
| 6 | 6 | 1 day | Ordinary collection scheme | 6 | 5 min | Single-phase watt-hour meter collection task |
| 7 | 7 | 1 month | Ordinary collection scheme | 7 | 5 min | Single-phase watt-hour meter collection task |
| 8 | 8 | 15 min | Ordinary collection scheme | 8 | 5 min | Single-phase watt-hour meter collection task |

TABLE 2

Three-phase watt-hour meter collection scheme

| Three-phase watt-hour meter | Content | Collection scheme | | | |
|---|---|---|---|---|---|
| | | Quasi-real-time collection task | Daily collection task | Monthly collection task | 15-min curve collection task |
| | Scheme number | 1 | 2 | 3 | 4 |
| | Storage depth | 1440 | 31 | 12 | 480 |
| | Collection mode | Collection of current data {0, NULL} | Collection by freezing time mark {2, NULL} | Collection by freezing time mark {2, NULL} | Collection by time mark interval {3, TI} |
| | Watt-hour meter set | User type {72, 74, 87} | User type {72, 74, 87} | User type {72, 74, 87} | User type {72, 74, 87} |
| | Storage time mark | 0: The storage time mark is a time mark when the distributed data collection unit performs collection successfully. | 3: relative to 23: 59 on a previous day | 7: relative to 23: 59 on the last day of a previous month | 6: time mark of data freezing |
| Minute-based freezing | 20000200, voltage | ● | | | |
| | 20010200, current | ● | | | |
| | 20010400, neutral line (zero-sequence) current | ● | | | |
| | 200A0200, power factor | ● | | | |

TABLE 2-continued

Three-phase watt-hour meter collection scheme

| Three-phase watt-hour meter | | Content | Quasi-real-time collection task | Daily collection task | Monthly collection task | 15-min curve collection task |
|---|---|---|---|---|---|---|
| | Daily freezing | 20210200, freezing time mark | | ● | | |
| | | 00100200, forward active electric energy | | ● | | |
| | | 00200200, reverse active electric energy | | ● | | |
| | | 00300200, combination reactive energy 1 | | ● | | |
| | | 00400200, combination reactive energy 2 | | ● | | |
| | | 00500200, first-quadrant reactive electric energy | | ● | | |
| | | 00600200, second-quadrant reactive electric energy | | ● | | |
| | | 00700200, third-quadrant reactive electric energy | | ● | | |
| | | 00800200, fourth-quadrant reactive electric energy | | ● | | |
| | | 10100200, maximum demand of forward active electric energy and occurrence time | | ● | | |
| | | 10200200, maximum demand of reverse active power and occurrence time | | ● | | |
| | | 10300200, maximum demand of combination reactive power I and occurrence time | | ● | | |
| | | 10400200, maximum demand of combination reactive power II and occurrence time | | ● | | |
| | Monthly freezing | 20210200, freezing time mark | | | ● | |
| | | 00100200, forward active electric energy | | | ● | |
| | | 00200200, reverse active electric energy | | | ● | |
| | | 00300200, combination reactive energy 1 | | | ● | |
| | | 00400200, combination reactive energy 2 | | | ● | |
| | | 00500200, first-quadrant reactive electric energy | | | ● | |
| | | 00600200, second-quadrant reactive electric energy | | | ● | |
| | | 00700200, third-quadrant reactive electric energy | | | ● | |
| | | 00800200, fourth-quadrant reactive electric energy | | | ● | |
| | | 10100200, maximum demand of forward active power and occurrence time | | | ● | |
| | | 10200200, maximum demand of reverse active power and occurrence time | | | ● | |
| | | 10300200, maximum demand of combination reactive power I and occurrence time | | | ● | |
| | | 10400200, maximum demand of combination reactive power II and occurrence time | | | ● | |

TABLE 2-continued

Three-phase watt-hour meter collection scheme

| Three-phase watt-hour meter | | Content | Collection scheme | | | |
|---|---|---|---|---|---|---|
| | | | Quasi-real-time collection task | Daily collection task | Monthly collection task | 15-min curve collection task |
| | Minute-based freezing | 00100201, total forward active electric energy | | | | ● |
| | | 00200201, total reverse active electric energy | | | | ● |
| | | 00500201, first-quadrant reactive electric energy | | | | ● |
| | | 00600201, second-quadrant reactive electric energy | | | | ● |
| | | 00700201, third-quadrant reactive electric energy | | | | ● |
| | | 00800201, fourth-quadrant reactive electric energy | | | | ● |

TABLE 3

Single-phase user collection scheme

| Low-voltage single-phase resident | | Content | Collection scheme | | | |
|---|---|---|---|---|---|---|
| | | | Quasi-real-time collection task | Daily collection task | Monthly collection task | 15-min collection task |
| | | Scheme number | 1 | 2 | 3 | 5 |
| | | Storage depth | 1440 | 31 | 12 | 480 |
| | | Collection mode | Collection of current data {0, NULL} | Collection by freezing time mark {2, NULL} | Collection by freezing time mark {2, NULL} | Collection by time mark interval {3, TI} |
| | | Watt-hour meter set | User type {82, 84, 88} | User type {82, 84, 88} | User type {82, 84, 88} | User type {82, 84, 88} |
| | | Storage time mark | 0: The storage time mark is a time mark when the distributed data collection unit performs collection successfully. | 3: relative to 23: 59 on a previous day | 7: relative to 23: 59 on the last day of a previous month | 6: time mark of data freezing |
| 1 | Minute-based freezing | 20000200, voltage | ● | | | |
| 2 | | 20010200, current | ● | | | |
| 3 | | 20010400, neutral line (zero-sequence) current | ● | | | |
| 4 | | 200A0200, power factor | ● | | | |
| 5 | Daily freezing | 20210200, freezing time mark | | ● | | |
| 6 | | 00100200, forward active electric energy | | ● | | |
| 7 | | 00200200, reverse active electric energy | | ● | | |
| 8 | Monthly freezing | 20210200, freezing time mark | | | ● | |
| 9 | | 00100200, forward active electric energy | | | ● | |
| 10 | | 00200200, reverse active electric energy | | | ● | |
| 11 | 15-minute-based freezing | 20210200, freezing time mark | | | | ● |
| 12 | | 00100201, total forward active electric energy | | | | ● |

TABLE 3-continued

Single-phase user collection scheme

| Low-voltage single-phase resident | Content | Collection scheme | | | |
|---|---|---|---|---|---|
| | | Quasi-real-time collection task | Daily collection task | Monthly collection task | 15-min collection task |
| 13 | 00200201, total reverse active electric energy | | | ● | |

The function of the quasi-real-time data collection task starting module of the distributed data collection unit includes: after the distributed data collection unit is powered on, the downlink communication module collects a clock of the watt-hour meter and uses the clock as a clock of the distributed data collection unit, and the quasi-real-time data collection task starting module of the distributed data collection unit starts the 15-minute curve task, the daily data freezing task, and the monthly data freezing task. Meanwhile, the HPLC submodule of the distributed data collection unit performs networking and clock synchronization with the main HPLC module of the centralized data collection unit. After a clock message of the main HPLC module is received, the quasi-real-time data collection task starting module of the distributed data collection unit starts a quasi-real-time data task.

Table 4 shows an extended clock synchronization message.

TABLE 4

ID of a newly added message

| Message ID | Meaning | Message port number |
|---|---|---|
| 0x0070 | Clock synchronization message | 0x11 |

Table 5 shows a format of the clock synchronization message.

TABLE 5

Format of a clock synchronization message of an HPLC module

| Domain | Byte ID | Bit | Domain size (bit) |
|---|---|---|---|
| Protocol version number | 0 | 0-5 | 6 |
| Message header length | | 6-7 | 6 |
| | 1 | 0-3 | |
| Reserved | | 4-7 | 4 |
| Real-time clock (RTC) | 2-7 | 0-47 | 48 |
| NTB time | 8-11 | 0-31 | 32 |

A value of the protocol version number is constantly 1 in a current version.

The message header length indicates a message length.

The RTC indicates an RTC when the message is created. The RTC adopts BCD encoding and is in a format of YYMMDDhhmmss (little-endian transmission, without a data bit indicating a week "X").

The NTB time indicates network-wide NTB time when the message is created, and its unit is NTB.

The data storage module of the distributed data collection unit is configured to store, in a flash memory in a cyclic first-in first-out (FIFO) manner, data that needs to be read in the collection task and scheme configuration module, to prevent the data from being lost after a power failure.

The user-based data reading module of the centralized data collection unit is configured to enable, by using a user-based meter reading message, the data storage module of the distributed data collection unit to perform data reporting. The 15-minute curve task, the daily data freezing task, and the monthly data freezing task are reported by using a routine reporting protocol message of an object-oriented data exchange protocol, and the quasi-real-time data task is reported by using a simplified reporting protocol message. User-based data reading and its corresponding response are performed according to a user-based data reading interaction process.

The main HPLC module of the centralized data collection unit is configured to perform data exchange with the user-based data reading module in a concurrent meter reading mode. The main HPLC module supports a communication baudrate A by default. The centralized data collection unit queries whether the main HPLC module supports a higher baudrate B. If the main HPLC module supports the higher baudrate B, the centralized data collection unit automatically adjusts the baudrate of the main HPLC module to B.

More specifically, the main HPLC module performs data exchange with the user-based data reading module in the concurrent meter reading mode. The main HPLC module supports a communication baudrate 1, namely, 9,600 bps, by default. The centralized data collection unit queries whether the main HPLC module supports a higher baudrate 2, namely, 115,200 bps. If the main HPLC module supports the higher baudrate 2, the centralized data collection unit automatically adjusts the baudrate of the main HPLC module to 115,200 bps.

The data storage module of the centralized data collection unit is configured to store the data read by the user-based data reading module in the flash memory.

The file conversion and uplink communication module of the centralized data collection unit is configured to generate a compressed file for the data in the data storage module of the centralized data collection unit based on a configurable file format. The data is obtained and reported through file transmission. In a preferred but nonrestrictive implementation, data transmission is performed by using the SFTP.

The file contains the following data items: datetime (data time), 20000201 (phase-A voltage), 20000202 (phase-B voltage), 20000203 (phase-C voltage), 20010201 (phase-A current), 20010202 (phase-B current), 20010203 (phase-C current), 20010400 (neutral line current), and the like.

The first JSONObject in real-time data content JSONArray represents a column header of a data column of a measured point, where coloumnhead is used as a key value, and a code of the data item OAD+(Chinese meaning) is used as a value. The second JSONObject and later fields in JSONArray show data of the measured point. A data format is as follows:

```
[
  {
      "coloumnhead":"dateTime (data time),20000201 (phase-A voltage),20000202
  (phase-B voltage),20000203(phase-C voltage),20010201(phase-A current),20010202(phase-B
  current),20010203(phase-C current),20010400(neutral line current) " },
  {
      "001546608804": "2020-03-29
  10:55:00,227.4,226.8,227.1,0.091,0.644,0.196,0.625 ,"
  },
  {
      "001529120135": "2020-03-29
  10:55:00,227.3,226.7,227.0,0.836,0.136,0.057,0.834 ,"
  },
  ...
]
```

In this embodiment of the present disclosure, the distributed data collection unit and the centralized data collection unit each may be one or more processors or chips that each has a communication interface, can realize a communication protocol, and may further include a memory, a related interface and system transmission bus, and the like if necessary. The processor or chip executes program-related code to realize a corresponding function. The HPLC submodule and the downlink communication module each may be one or more processors or chips that each has a communication interface and can realize a communication protocol. The collection task and scheme configuration module and the quasi-real-time data collection task starting module each may be one or more processors or controllers. The processor, controller, or chip executes program-related code to realize a corresponding function. The file conversion and uplink communication module and the main HPLC module each may be one or more processors or chips that each has a communication interface and can realize a communication protocol. The user-based data reading module may be one or more processors or controllers. The processor, controller, or chip executes program-related code to realize a corresponding function.

Figure 5:
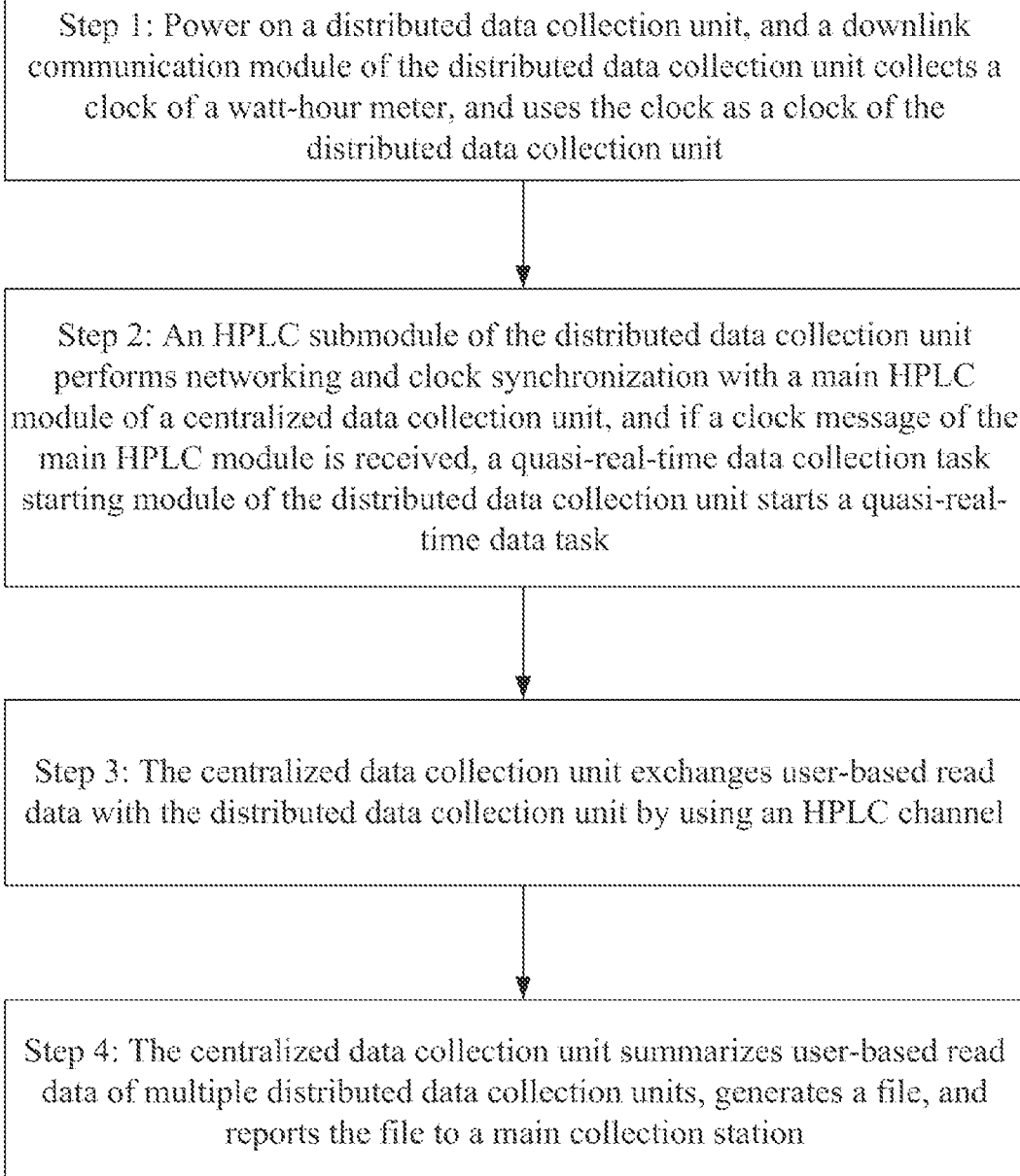
FIG. 5 shows a quasi-real-time electricity consumption data collection method based on a quasi-real-time electricity consumption data collection system for a competitive power market.

Embodiment 2: Quasi-Real-Time Data Collection Method for a Competitive Power Market As shown in FIG. 5, a quasi-real-time data collection method based on the quasi-real-time data collection system for a competitive power market in Embodiment 1 includes the following steps:

Step 1: Power on the distributed data collection unit. The downlink communication module of the distributed data collection unit collects a clock of the watt-hour meter, and uses the clock as a clock of the distributed data collection unit.

Step 2: The HPLC submodule of the distributed data collection unit performs networking and clock synchronization with the main HPLC module of the centralized data collection unit, and if a clock message of the main HPLC module is received, the quasi-real-time data collection task starting module of the distributed data collection unit starts a quasi-real-time data task. Step 2 further includes: starting a 15-minute curve task, a daily data freezing task, and a monthly data freezing task. It should be noted that those skilled in the art can arbitrarily specify a starting order of each task based on an actual need on site. A preferred but nonrestrictive implementation is to start each task based on a priority order of the task.

Step 3: The centralized data collection unit exchanges user-based read data with the distributed data collection unit by using an HPLC channel.

Figure 2:
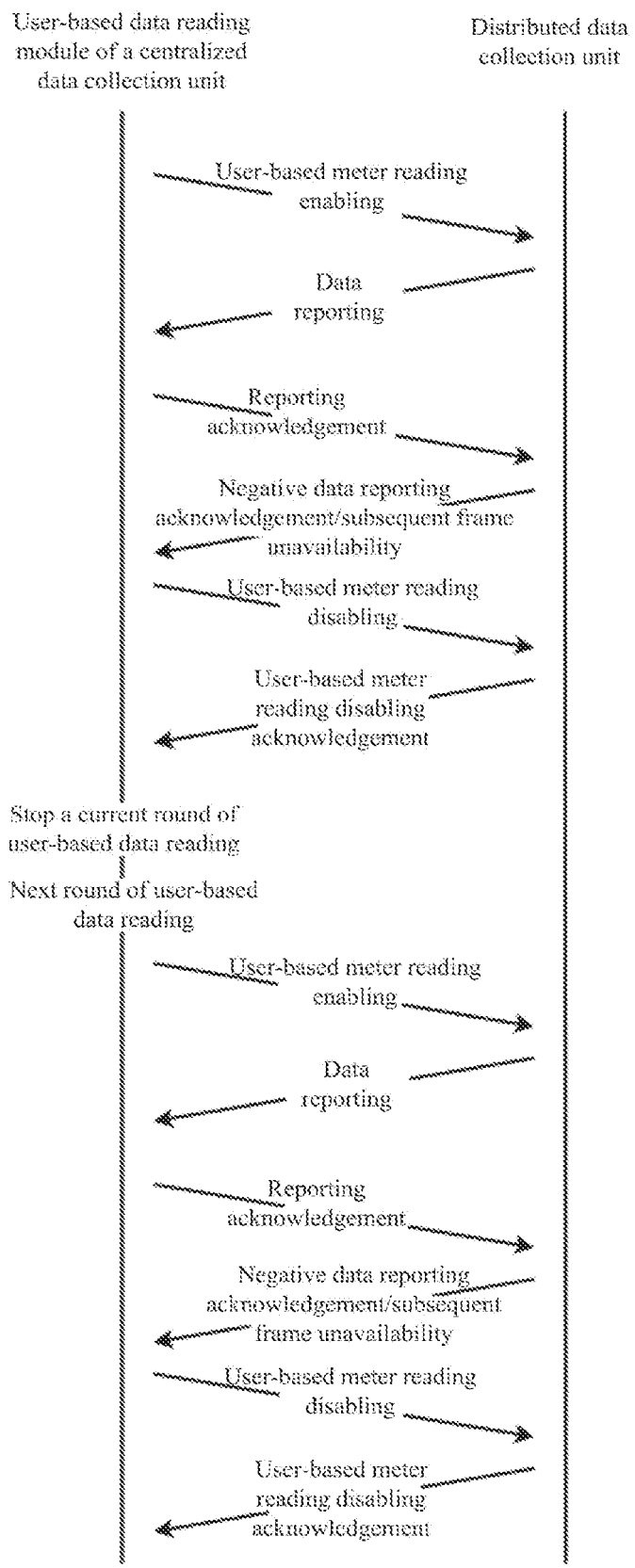
FIG. 2 shows a first case in which a centralized data collection unit exchanges user-based read data with a distributed data collection unit by using an HPLC channel.

FIG. 2 shows a first case in which the centralized data collection unit exchanges the user-based read data with the distributed data collection unit by using the HPLC channel. The exchanging user-based read data in step 3 specifically includes the following steps:

Step 3.1: The user-based data reading module of the centralized data collection unit sends a "user-based meter reading enabling" message to the distributed data collection unit.

Step 3.2: The distributed data collection unit sends a "data reporting" message to the user-based data reading module after receiving the "user-based meter reading enabling" message.

Step 3.3: The user-based data reading module sends a "reporting acknowledgement" message to the distributed data collection unit after receiving the "data reporting" message.

Step 3.4: After receiving the "reporting acknowledgement" message, the distributed data collection unit continuously sends a "data reporting" message to the user-based data reading module and returns to perform step 3.3 if there still is data to be reported; or sends a "negative data reporting acknowledgement/subsequent frame unavailability" message to the user-based data reading module if there is no data to be reported.

Step 3.5: The user-based data reading module sends a "user-based meter reading disabling" message to the distributed data collection unit after receiving the "negative data reporting acknowledgement/subsequent frame unavailability" message.

Step 3.6: The distributed data collection unit sends a "user-based meter reading disabling acknowledgement" message to the user-based data reading module after receiving the "user-based meter reading disabling" message, to complete a round of user-based meter reading, and returns to perform step 3.1.

Figure 3:
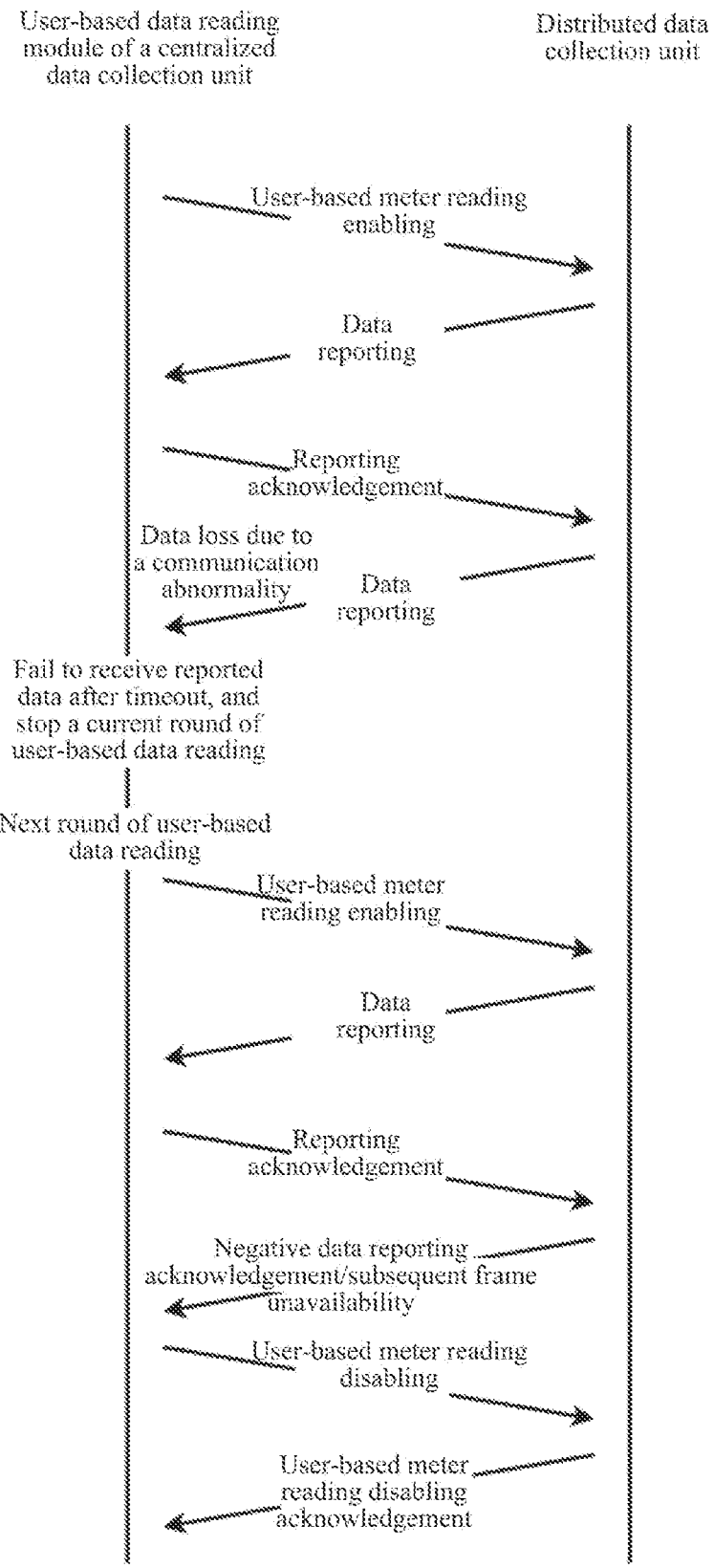
FIG. 3 shows a second case in which a centralized data collection unit exchanges user-based read data with a distributed data collection unit by using an HPLC channel.

FIG. 3 shows a second case in which the centralized data collection unit exchanges the user-based read data with the distributed data collection unit by using the HPLC channel. When the distributed data collection unit sends the "data reporting" message to the centralized data collection unit, if a communication abnormality occurs and reported data is lost due to the abnormality, the user-based data reading module performs timeout processing, stops a current user-based meter reading task, and returns to perform step 3.1.

Figure 4:
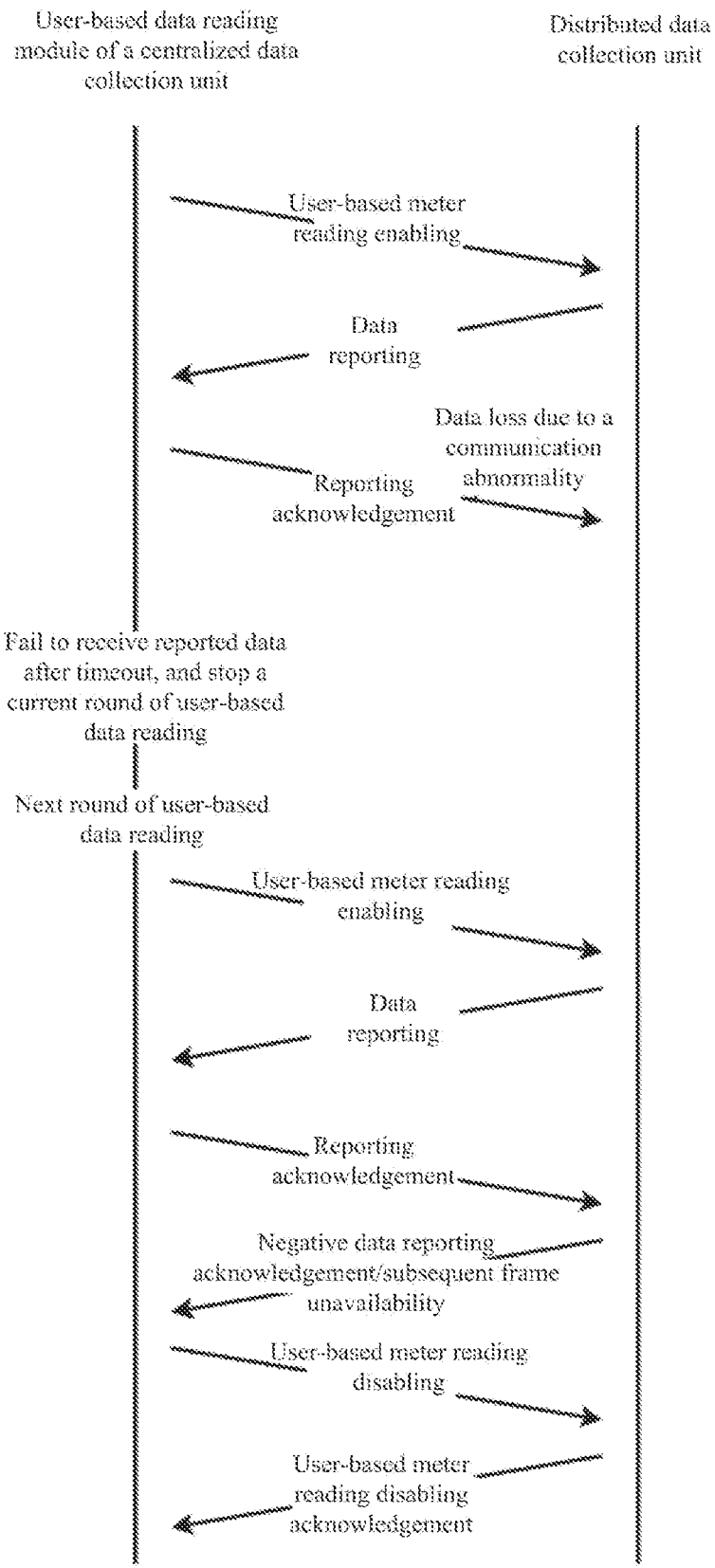
FIG. 4 shows a third case in which a centralized data collection unit exchanges user-based read data with a distributed data collection unit by using an HPLC channel.

FIG. 4 shows a third case in which the centralized data collection unit exchanges the user-based read data with the distributed data collection unit by using the HPLC channel. When the centralized data collection unit sends the "reporting acknowledgement" message to the distributed data collection unit, if a communication abnormality occurs and reported data is lost due to the abnormality, the user-based data reading module performs timeout processing, stops a current round of user-based meter reading, and returns to perform step 3.1.

As shown in FIG. 3 and FIG. 4, in a next round of user-based meter reading, the distributed data collection unit resends the "data reporting" message that is not successfully reported in a previous round of user-based meter reading.

Step 4: The centralized data collection unit summarizes user-based read data of multiple distributed data collection units, generates a file, and reports the file to the main collection station.

A simplified data reporting protocol splits composite data into individual data items, and then performs framing in an order of "OAD", "RSD", "ROAD", and "response data". The response data is framed in an order of a "record row data type A-SimplifyRecordRowDataType" and "M record data values SEQUENCE OF A-SimplifyRecordRow".

The newly designed simplified protocol architecture also realizes a constraint on an application. It is necessary to make a special agreement on composite data in the field of electricity consumption information collection. This transmission mode is ingeniously used to improve transmission efficiency.

The simplified protocol is as follows:

| Data type definition | Note |
|---|---|
| ReportNotificationSimplifyRecord::=SEQUENCE<br>{<br>  Service SN-priority-ACD   PIID-ACD,<br>  Simplified record object attribute and data<br>  A-ResultSimplifyRecord<br>} | |

Definition of A-ResultSimplifyRecord:

| Data type definition | | Note |
|---|---|---|
| GetResponseSimplifyRecord::=SEQUENCE<br>{<br>Service SN-priority-ACD        PIID-ACD,<br>An simplified record object attribute and its result | A-ResultSimplifyRecord | For the PIID-ACD, refer to parts 4 and 5 in DL/T698.45-2017 Electric Energy Information Collection and Management System. An object-oriented data exchange protocol is used as a communication protocol.<br>For the DAR, refer to parts 4 and 5 in DL/T698.45-2017 Electric Energy Information Collection and Management System. The object-oriented data exchange protocol is used as the communication protocol. |
| }| | |
|   A-ResultSimplifyRecord::=SEQUENCE<br>  {<br>    OAD,<br>  RSD,<br>    ROAD,<br>    Response data               CHOICE<br>    {<br>  Error information        [0] DAR,<br>  Record            [1] A-SimplifyRecord<br>    }<br>  }<br>  A-SimplifyRecord::=SEQUENCE<br>  {<br>    Record column data type A-SimplifyRecordRowDataType<br>    M record data values SEQUENCE OF A-SimplifyRecordRow<br>  }<br>  A-SimplifyRecordRowDataType::=SEQUENCE<br>  {<br>    First-column data type   CHOICE,<br>    Second-column data type   CHOICE,<br>    ...<br>    $N^{th}$-column data type   CHOICE<br>  }<br>  A-SimplifyRecordRow::=SEQUENCE<br>  {<br>    First-column data value,<br>    Second-column data value,<br>    ...<br>    $N^{th}$-column data value<br>  } | | |

An example simplified data reporting message is as follows:

```
68 LL LL 83 15 08 02 00 00 00 00 00 34 3F // (LL: calculated based on an actual message
length)
88 06 02
60 12 03 00                    // OAD
07                             // RSD=7
07 E4 01 07 00 00 00           // Start time: 2020-01-07 00:00:00
07 E4 01 07 00 09 3B           // End time: 2020-01-07 00:09:59
01 00 01                       // Interval: 1 min
03                             // MS: one group of user addresses
03                             // 3 groups
07 05 00 00 00 00 00 01        // TSA: 0x000000000001
07 05 00 00 00 00 00 02        // TSA: 0x000000000002
07 05 00 00 00 00 00 03        // TSA: 0x000000000003
50 02 02 00                    // ROAD
04                             // 5 correlated OADs
20 00 02 01                    // Phase-A voltage
20 01 02 01                    // Phase-A current
20 01 04 00                    // Zero-sequence current
20 0A 02 01                    // Power factor (total)
20 0A 02 02                    // Power factor (phase A)
01                             // Record [1] A-SimplifyRecord
12                             // long-unsigned OAD 20000201 type (2Byte)
05                             // double-long OAD 20010201 type (4Byte)
05                             // double-long OAD 20010400 type (4Byte)
10                             // long OAD 200A0201 type (2Byte)
10                             // long OAD 200A0202 type (2Byte)
1E                             // M record data values SEQUENCE OF A-
SimplifyRecordRow: 30 (there are 3 watt-hour meters, with 10 records per watt-hour meter)
// 10 records of a first watt-hour meter whose TSA is 0x000000000001
    11 11 22 22 22 22 33 33 33 33 44 44 55 55 // REC1 (voltage value: 0x1111; current:
0x2222222; zero-sequence current: 0x33333333; total power factor: 0x4444; single-phase power
factor: 0x5555)
    11 11 22 22 22 22 33 33 33 33 44 44 55 55 // REC2
    FF FF 22 22 22 22 FF FF FF FF FF FF FF FF // REC3 (voltage value: NULL; current:
0x2222222; zero-sequence current: NULL; total power factor: NULL; single-phase power
factor: NULL)
    11 11 22 22 22 22 33 33 33 33 44 44 55 55 // REC4
    11 11 22 22 22 22 33 33 33 33 44 44 55 55 // REC5
    11 11 22 22 22 22 33 33 33 33 44 44 55 55 // REC6
    FF FF FF FF FF FF FF FF FF FF FF FF FF FF // REC7 (voltage value: NULL; current:
NULL; zero-sequence current: NULL; total power factor: NULL; single-phase power factor:
NULL)
    11 11 22 22 22 22 33 33 33 33 44 44 55 55 // REC8
    11 11 22 22 22 22 33 33 33 33 44 44 55 55 // REC9
    11 11 22 22 22 22 33 33 33 33 44 44 55 55 // REC10
// 10 records of a second watt-hour meter whose TSA is 0x000000000002
    11 11 22 22 22 22 33 33 33 33 44 44 55 55 // REC1 (voltage value: 0x1111; current:
0x2222222; zero-sequence current: 0x33333333; total power factor: 0x4444; single-phase power
factor: 0x5555)
    11 11 22 22 22 22 33 33 33 33 44 44 55 55 // REC2
    FF FF 22 22 22 22 FF FF FF FF FF FF FF FF // REC3 (voltage value: NULL; current:
0x2222222; zero-sequence current: NULL; total power factor: NULL; single-phase power
factor: NULL)
    11 11 22 22 22 22 33 33 33 33 44 44 55 55 // REC4
    11 11 22 22 22 22 33 33 33 33 44 44 55 55 // REC5
    11 11 22 22 22 22 33 33 33 33 44 44 55 55 // REC6
    FF FF FF FF FF FF FF FF FF FF FF FF FF FF // REC7 (voltage value: NULL; current:
NULL; zero-sequence current: NULL; total power factor: NULL; single-phase power factor:
NULL)
    11 11 22 22 22 22 33 33 33 33 44 44 55 55 // REC8
    11 11 22 22 22 22 33 33 33 33 44 44 55 55 // REC9
    FF FF FF FF FF FF FF FF FF FF FF FF FF FF // REC10 (voltage value: NULL; current:
NULL; zero-sequence current: NULL; total power factor: NULL; single-phase power factor:
NULL)
// 10 records of a third watt-hour meter whose TSA is 0x000000000003
    11 11 22 22 22 22 33 33 33 33 44 44 55 55 // REC1 (voltage value: 0x1111; current:
0x2222222; zero-sequence current: 0x33333333; total power factor: 0x4444; single-phase power
factor: 0x5555)
    11 11 22 22 22 22 33 33 33 33 44 44 55 55 // REC2
    FF FF 22 22 22 22 FF FF FF FF FF FF FF FF // REC3 (voltage value: NULL; current:
0x2222222; zero-sequence current: NULL; total power factor: NULL; single-phase power
factor: NULL)
    11 11 22 22 22 22 33 33 33 33 44 44 55 55 // REC4
    11 11 22 22 22 22 33 33 33 33 44 44 55 55 // REC5
    FF FF FF FF FF FF FF FF FF FF FF FF FF FF // REC6 (voltage value: NULL; current:
NULL; zero-sequence current: NULL; total power factor: NULL; single-phase power factor:
NULL)
    FF FF FF FF FF FF FF FF FF FF FF FF FF FF // REC7 (voltage value: NULL; current:
```

-continued

NULL; zero-sequence current: NULL; total power factor: NULL; single-phase power factor: NULL)
11 11 22 22 22 22 33 33 33 33 44 44 55 55 // REC8
11 11 22 22 22 22 33 33 33 33 44 44 55 55 // REC9
11 11 22 22 22 22 33 33 33 33 44 44 55 55 // REC10
00 00 B9 7E 16

The present disclosure has the following beneficial effects: Compared with the prior art, the present disclosure provides a quasi-real-time electricity consumption data collection system and method for a competitive power market. A collection task and a collection scheme are distributed to a distributed data collection unit, a centralized data collection unit performs user-based meter reading on each distributed data collection unit, a quasi-real-time collection task realizes centralized reporting for multiple watt-hour meters and multiple data items by using a simplified protocol in a user-based meter reading interaction process, an HPLC channel is fully used, and the centralized data collection unit generates a file and reports the file to a main collection station. The present disclosure realizes concurrent asynchronous meter reading for the centralized data collection unit and the distributed data collection unit, greatly improves timeliness of electricity consumption data, and has a good application prospect. In addition, a simplified protocol architecture is newly designed, a constraint is also made on an application. It is necessary to make a special agreement on composite data in the field of electricity consumption information collection. This transmission mode is ingeniously used to improve transmission efficiency.

The applicant of the present disclosure has made a detailed description of the implementation examples of the present disclosure with reference to the accompanying drawings in the specification. However, those skilled in the art should understand that the above implementation examples are only preferred implementation solutions of the present disclosure, and the detailed description is only to help readers better understand the spirit of the present disclosure, rather than to limit the protection scope of the present disclosure. On the contrary, any improvement or modification based on the spirit of the present disclosure shall fall within the protection scope of the present disclosure.

The invention claimed is:

1. A quasi-real-time data collection system for a competitive power market, comprising distributed data collection units, a centralized data collection unit, and a main collection station, wherein
each of the distributed data collection units is connected to an intelligent watt-hour meter by using an internal downlink communication module of each of the distributed data collection units, and configures data item collection parameters and task execution parameters by using an internal collection task and scheme configuration module of each of the distributed data collection units, comprising: a quasi-real-time collection task, a 15-minute curve task, a daily data freezing task, and a monthly data freezing task;
the centralized data collection unit is connected to the main collection station by using an internal file conversion and uplink communication module of the centralized data collection unit; and
the centralized data collection unit is connected to the distributed data collection units by using a local high speed power line carrier communication (HPLC) network composed of an internal main HPLC module of the centralized data collection unit and an internal HPLC submodule of each of the distributed data collection units.

2. The quasi-real-time data collection system for a competitive power market according to claim 1, wherein
the collection task and scheme configuration module of each of the distributed data collection units is further configured to configure at least a collection scheme number, a storage depth, a collection mode, a watt-hour meter set, a storage time mark, and an electricity consumption data identifier.

3. The quasi-real-time data collection system for a competitive power market according to claim 2, wherein
each of the distributed data collection units further comprises: a quasi-real-time data collection task starting module, connected to the collection task and scheme configuration module, and configured to start the quasi-real-time collection task, the 15-minute curve task, the daily data freezing task, and the monthly data freezing task in a specified order.

4. The quasi-real-time data collection system for a competitive power market according to claim 3, wherein
the quasi-real-time data collection task starting module receives a clock message of the main HPLC module by using the HPLC submodule.

5. The quasi-real-time data collection system for a competitive power market according to claim 1, wherein
both a data storage module of the centralized data collection unit and a data storage module of each of the distributed data collection units are flash memories.

6. The quasi-real-time data collection system for a competitive power market according to claim 5, wherein
the centralized data collection unit comprises: a user-based data reading module, configured to enable, by using a user-based meter reading message, the data storage module of each of the distributed data collection units to perform data reporting.

7. The quasi-real-time data collection system for a competitive power market according to claim 6, wherein
the main HPLC module of the centralized data collection unit is configured to perform data exchange with the user-based data reading module in a concurrent meter reading mode, and the main HPLC module supports a variety of communication baudrates, and preferentially uses a high baudrate for communication.

8. The quasi-real-time data collection system for a competitive power market according to claim 5, wherein
the file conversion and uplink communication module of the centralized data collection unit is configured to generate a compressed file for data in the data storage module of the centralized data collection unit and perform data exchange with the main collection station.

9. A quasi-real-time data collection method based on a-quasi-real-time data collection system for a competitive power market according to claim 1, the method comprising:

step 1: powering on each of the distributed data collection units, and collecting, by the downlink communication module of each of the distributed data collection units, time information of a clock of the watt-hour meter, and using the time information of the clock as a time of a clock of each of the distributed data collection units;

step 2: performing, by the HPLC submodule of each of the distributed data collection units, networking and clock synchronization with the main HPLC module of the centralized data collection unit, and if a clock message of the main HPLC module is received, starting, by a quasi-real-time data collection task starting module of each of the distributed data collection units, a quasi-real-time data task;

step 3: exchanging, by the centralized data collection unit, user-based read data with each of the distributed data collection units by using an HPLC channel; and step 4 summarizing, by the centralized data collection unit, user-based read data of the distributed data collection units, generating a file, and reporting the file to the main collection station.

10. The quasi-real-time data collection method according to claim 9, wherein
step 2 further comprises: starting a 15-minute curve task, a daily data freezing task, and a monthly data freezing task in a specified order.

11. The quasi-real-time data collection method according to claim 9, wherein
the exchanging user-based read data in step 3 specifically comprises:
step 3.1: sending, by a user-based data reading module of the centralized data collection unit, a "user-based meter reading enabling" message to each of the distributed data collection units;
step 3.2: sending, by each of the distributed data collection units, a "data reporting" message to the user-based data reading module after receiving the "user-based meter reading enabling" message;
step 3.3: sending, by the user-based data reading module, a "reporting acknowledgement" message to each of the distributed data collection units after receiving their corresponding "data reporting" message;
step 3.4: after receiving the "reporting acknowledgement" message, continuously sending, by each of the distributed data collection units, a "data reporting" message to the user-based data reading module and returning to perform step 3.3 if there still is data to be reported; or sending a "negative data reporting acknowledgement/subsequent frame unavailability" message to the user-based data reading module if there is no data to be reported;
step 3.5: sending, by the user-based data reading module, a "user-based meter reading disabling" message to each of the distributed data collection units after receiving their corresponding "negative data reporting acknowledgement/subsequent frame unavailability" message; and
step 3.6: sending, by each of the distributed data collection units, a "user-based meter reading disabling acknowledgement" message to the user-based data reading module after receiving the "user-based meter reading disabling" message, to complete a round of user-based meter reading, and returning to perform step 3.1.

12. The quasi-real-time data collection method according to claim 11, wherein
in step 3, when each of the distributed data collection units sends the "data reporting" message to the centralized data collection unit, if a communication abnormality occurs and reported data is lost due to the abnormality, the user-based data reading module performs timeout processing, stops a current user-based meter reading task, and returns to perform step 3.1; and in a next round of user-based meter reading, each of the distributed data collection units resends the "data reporting" message that is not successfully reported in a previous round of user-based meter reading.

13. The quasi-real-time data collection method according to claim 11, wherein
in step 3, when the centralized data collection unit sends the "reporting acknowledgement" message to each of the distributed data collection units, if a communication abnormality occurs and reported data is lost due to the abnormality, the user-based data reading module performs timeout processing, stops a current round of user-based meter reading, and returns to perform step 3.1; and in a next round of user-based meter reading, each of the distributed data collection units resends the "data reporting" message that is not successfully reported in a previous round of user-based meter reading.

14. The quasi-real-time data collection method according to claim 9, wherein
in step 4, the centralized data collection unit reports, to the main collection station, data reported by each of the distributed data collection units by using a simplified data reporting protocol, wherein the simplified data reporting protocol is framed in an order of an object attribute descriptor (OAD), a record selection descriptor (RSD), a record object attribute descriptor (ROAD), and response data.

15. The quasi-real-time data collection method according to claim 9, wherein
in step 4, a response data is framed in an order of a record column data type and multiple record data values.

* * * * *